US006038752A

United States Patent [19]

Finsterwald et al.

[11] Patent Number: 6,038,752

[45] Date of Patent: Mar. 21, 2000

[54] METHOD FOR MANUFACTURING AN ULTRASONIC TRANSDUCER INCORPORATING AN ARRAY OF SLOTTED TRANSDUCER ELEMENTS

[75] Inventors: P. Michael Finsterwald, Scottsdale; Stephen Joseph Douglas, Chandler; Ricky Gail Just, Phoenix, all of Ariz.

[73] Assignee: Parallel Design, Inc., Tempe, Ariz.

[21] Appl. No.: 09/370,836

[22] Filed: Aug. 9, 1999

Related U.S. Application Data

[62] Division of application No. 08/871,211, Jun. 9, 1997, Pat. No. 6,014,898, which is a division of application No. 08/374,251, Jan. 18, 1995, Pat. No. 5,637,800, which is a division of application No. 08/010,827, Jan. 29, 1993, Pat. No. 5,423,220.

[51] Int. Cl.$^{7}$ .................................................. H01L 41/22

[52] U.S. Cl. .......................................... 29/25.35; 310/336

[58] Field of Search .......................... 29/25.35; 310/334, 310/336, 365, 366

[56] References Cited

U.S. PATENT DOCUMENTS

| | | | |
|---|---|---|---|
| 3,666,979 | 5/1972 | McElroy | 310/9.6 |
| 4,211,948 | 7/1980 | Smith et al. | 310/322 |
| 4,211,949 | 7/1980 | Brisken et al. | 310/322 |
| 4,281,550 | 8/1981 | Erikson | 73/626 |
| 4,326,418 | 4/1982 | Pell, Jr. | 73/644 |
| 4,424,465 | 1/1984 | Ohigashi et al. | 310/335 |
| 4,462,092 | 7/1984 | Kawabuchi et al. | 367/105 |
| 4,523,122 | 6/1985 | Tone et al. | 310/334 |
| 4,546,283 | 10/1985 | Adamo et al. | 310/313 |
| 4,734,963 | 4/1988 | Ishiyama | 29/25.35 |
| 4,747,192 | 5/1988 | Rokurota | 29/25.35 |
| 4,869,768 | 9/1989 | Zola | 156/245 |
| 5,042,492 | 8/1991 | Dubut | 128/662.03 |
| 5,042,493 | 8/1991 | Saito et al. | 128/662.03 |
| 5,044,053 | 9/1991 | Kopel et al. | 29/25.35 |
| 5,091,893 | 2/1992 | Smith et al. | 367/153 |
| 5,291,090 | 3/1994 | Dias | 310/334 |

FOREIGN PATENT DOCUMENTS

| | | |
|---|---|---|
| 0 145 429 | 6/1985 | European Pat. Off. . |
| 0 272 960 | 6/1988 | European Pat. Off. . |

*Primary Examiner*—Carl E. Hall
*Attorney, Agent, or Firm*—Sheppard, Mullin, Richter & Hampton LLP; James R. Brueggemann

[57] ABSTRACT

An ultrasonic transducer array, and a method for manufacturing it, having a plurality of transducer elements aligned along an array axis in an imaging plane. Each transducer element includes a piezoelectric layer and one or more acoustic matching layers. The piezoelectric layer has a concave front surface overlayed by a front electrode and a rear surface overlayed by a rear electrode. The shape of each transducer element is selected such that it is mechanically focused into the imaging plane. A backing support holds the plurality of transducer elements in a predetermined relationship along the array axis such that each element is mechanically focused in the imaging plane.

24 Claims, 9 Drawing Sheets

METHOD FOR MANUFACTURING AN ULTRASONIC TRANSDUCER INCORPORATING AN ARRAY OF SLOTTED TRANSDUCER ELEMENTS

This is a division of application Ser. No. 08/871,211, filed Jun. 9, 1997, now U.S. Pat. No. 6,014,898, which is a division of application Ser. No. 08/374,251, filed Jan. 18, 1995, now U.S. Pat. No. 5,637,800, which is a division of application Ser. No. 08/010,827, filed Jan. 29, 1993, now U.S. Pat. No. 5,423,220.

BACKGROUND OF THE INVENTION

This invention relates generally to ultrasonic transducer arrays and, more particularly, to an array having a plurality of individual, acoustically isolated elements that are uniformly distributed along an axis which is straight, curvilinear, or both.

Ultrasonic transducer arrays are well-known in the art and have many applications, including diagnostic medical imaging, fluid flow sensing and the non-destructive testing of materials. Such applications typically require high sensitivity and broad band frequency response for optimum resolving power.

An ultrasonic transducer array typically includes a plurality of individual transducer elements that are uniformly spaced along an array axis that is straight (i.e., a linear array), or curvilinear (e.g., a concave or convex array). The transducer elements each include a piezoelectric layer. The transducer elements also include one or more overlaying acoustic matching layers, typically each one-quarter wavelength thick. The array is electrically driven by variation of the transmit timing between adjacent transducer elements to produce a focused sound beam in an imaging plane. Increased transducer performance is achieved by electrically matching the individual transducer elements to a pulser/receiver circuit, by acoustically matching the individual transducer elements to the body to be tested, and by acoustically isolating the individual elements from each other. The acoustic matching layers are commonly employed to improve the transfer of sound energy from the piezoelectric elements into the body to be tested.

In addition to electronic focusing within the imaging plane, it is also necessary to provide for out-of-plane focusing. This is typically accomplished mechanically by using piezoelectric layers having concave surfaces or by using flat piezoelectric layers in conjunction with an acoustic lens.

One known transducer array that incorporates mechanical focusing is made with a plano-concave piezoelectric substrate. The cavity formed by the concave surface is filled with a polymer mixture, such as a tungsten-epoxy mixture, and then ground flat. An epoxy layer substrate or suitable quarter wave matching layer substrate is then affixed to the flat surface of the filler layer to improve transfer of acoustic energy from the device. Individual transducer elements are formed by cutting the resulting sandwiched substrates with a dicing saw. In the cutting process, the quarter wave matching layer substrate is uncut or only partially cut through so as to leave the individual transducer elements connected. The result of this construction is to provide an array that is mechanically focused while having a flat surface as its front face. After electrical connections are made to the individual transducer elements and the array formed to its desired configuration (e.g., linear, concave, convex), a backing layer is affixed to support the transducer elements and to absorb or reflect acoustic energy transmitted from the piezoelectric substrate.

One drawback of this array is that it provides an undesirable narrow band frequency response and low sensitivity. In particular, the non-uniform thickness of the filler layer inhibits the transfer of acoustic energy over a broad frequency range from the piezoelectric material into the body being scanned. Further, narrow band frequency response increases the pulse length of the transmitted acoustic wave and thus limits the array's axial resolution. Another drawback is that the contiguous acoustic matching layer gives rise to undesirable interelement crosstalk.

Another common construction technique for making transducer arrays is described in U.S. Pat. No. 4,734,963 to Ishiyama. In that technique, a flat plate of piezoelectric material is used and a flexible printed circuit board having electrode lead patterns is bonded to a portion of a back surface of the flat plate. Similarly, flat quarter wave matching layers of uniform thickness are affixed to the front of the flat piezoelectric plate. A flexible backing plate is attached to the back surface of the piezoelectric plate and captures a portion of the flexible printed circuit board attached. The individual transducer elements are formed by cutting through the flat piezoelectric plate and corresponding flat acoustic matching layers with a dicing saw through to the flexible backing plate. The flexible backing plate is then formed along an axis that is straight, concave, or convex and bonded to a backing base. A silicone elastomer lens is affixed to the front surface of the quarter wave matching layers to effect the desired mechanical focusing of the individual elements.

One disadvantage of this construction is that the sensitivity of the transducer elements is negatively affected by the inefficiency of the silicone lens. A silicone lens results in frequency dependent losses which are high in the range commonly used for imaging arrays (3.5 to 10 Mhz). Manufacturability is also negatively affected by the requirement for precise alignment of the silicone lens with respect to individual elements of the array.

A further construction technique, described in U.S. Pat. No. 5,042,492 to Dubut, uses a concave arrangement of piezoelectric elements that are affixed along their front surfaces to a continuous, deformable, acoustic transition blade. The blade includes a metallization layer to electrically connect the front surfaces of the piezoelectric elements. The rear surfaces of the piezoelectric elements are individually connected to separate lead wires. A disadvantage of this construction is that the blade metallization and the blade itself are continuous across the piezoelectric elements, adversely affecting the transducer performance. Additionally, the individual attachment of lead wires to the piezoelectric elements is time consuming and possibly damaging to the material.

In view of the above, it should be appreciated that there is still a need for an improved array of ultrasonic transducer elements, wherein each element has a piezoelectric layer that is mechanically focused without the necessity of an acoustic lens and that is affixed to one or more uniform thickness, similarly focused, quarter wave matching layers. The individual transducer elements, including the respective piezoelectric and matching layers, should also be mechanically isolated from each other along the array axis to form independent transducer elements that are formable along a linear or curvilinear path. There is a further need for an array providing reduced lateral resonance modes and a reduced bulk acoustic impedance of the piezoelectric layers. There is also a need to reduce the time necessary to connect the individual leads and/or ground wires to the transducer elements as well as to minimize the damage caused to the transducer array during the electrical interconnection operation. The present invention satisfies this need.

SUMMARY OF THE INVENTION

The present invention is embodied in an ultrasonic transducer array having individual transducer elements that are mechanically focused into an imaging plane, are acoustically matched to the medium being interrogated, and are acoustically isolated from each other along an array axis in the imaging plane, resulting in improved acoustic performance, improved sensitivity, increased bandwidth and improved focal characteristics. The present invention is further embodied in an improved method for making the above described array and electrically connecting the leads and ground wires to the individual transducer elements in a single operation that is relatively easy and damage free. The improved method also results in an array wherein the transducer elements are particularly true and uniform along the array axis.

The ultrasonic transducer array of the present invention may be in the form of a probe for use with ultrasound apparatus. The array includes a plurality of individual transducer elements with each transducer element possessing a piezoelectric layer having a concave front surface and a rear surface and an acoustic matching layer having a concave front surface, a rear surface and uniform thickness. The term concave is meant to include indentations that are formed of curved segments or straight segments or a combination thereof. The rear surface of the acoustic matching layer is mounted to the concave front surface of the piezoelectric layer. The shapes of the front surface of the piezoelectric layer and the front and rear surfaces of the acoustic matching layer are suitable to mechanically focus the respective transducer element into an imaging plane. The array further includes a backing support that supports the transducer elements in a spaced apart relationship and aligns the transducer elements along an array axis located in the imaging plane.

In a separate feature of the present invention, the front surface of the piezoelectric layer may include a series of slots arranged in the direction of the array axis. The slots serve the purpose of minimizing lateral resonance modes and reducing the bulk acoustic impedance of the piezoelectric layer. In addition, if a concave shape is desired for mechanical focusing, the slots permit the piezoelectric layer to be readily formed into a concave shape.

Another feature of the present invention is the electrical interconnection of the individual transducer elements of the array. In particular, during the manufacturing process, a piezoelectric substrate (that will eventually be mounted to an acoustic matching layer substrate and cut to form the individual transducer elements) is metallized and a rear surface thereof provided with isolation cuts to form a wrap-around front surface electrode and an isolated rear surface electrode. Prior to cutting the combined piezoelectric/acoustic matching layer substrates into the individual transducer elements, a flexible printed circuit board having electrode lead patterns may be soldered to the isolated rear surface electrode. Ground foils may be soldered to the wrap-around front surface electrode. Cutting the piezoelectric substrate at this time will then result in each transducer element having its own electrode lead and ground connection. In the case where the concave front surfaces are slotted as mentioned above (thus resulting in a discontinuity in the wrap-around front surface electrode), a layer of suitably conductive material, such as copper, may be interposed between the piezoelectric substrate and the acoustic matching layer substrate to ensure electrical connection across the slots to the ground connection.

Another feature of the invention is that the individual transducer elements themselves may be subdivided while maintaining the electrical interconnection thereto. Such a structure further reduces spurious lateral resonance modes and inter-element crosstalk.

The improved method of making the ultrasonic transducer array described above includes the steps of providing a piezoelectric substrate having a front concave surface and a rear surface and applying one or more acoustic matching layers of substantially uniform thickness to the concave front surface of the piezoelectric substrate to produce an intermediate assembly. The intermediate assembly is affixed to a flexible front carrier plate and a series of substantially parallel cuts are made completely through the intermediate assembly and into the flexible front carrier plate. The cuts form a series of individual transducer elements aligned along an array axis, each having a piezoelectric layer and an acoustic matching layer or layers. Next, the parallel cut intermediate assembly is formed into a desired shape by bending the layers against the yielding bias of the flexible front carrier plate about an array axis in the imaging plane. The formed intermediate assembly is then affixed to a backing support adjacent the rear surface of the piezoelectric substrate and the temporary front carrier plate is removed yielding the ultrasonic transducer array.

An added beneficial step to the above described method is to make a series of parallel cuts substantially through the piezoelectric substrate to form the aforementioned slots in the concave front surface of the piezoelectric substrate. Yet another beneficial step is the use of a thermoplastic adhesive between the flexible front carrier plate and the acoustic matching layer(s), wherein the thermoplastic adhesive loses its adhesion above a predetermined temperature and releases the carrier plate.

The above method may be further improved by filling the cuts and slots with a low impedance acoustically attenuative material to further improve the resonance quality of the array. Further benefits may be obtained by affixing an elastomeric filler layer to the exposed concave surface of the acoustic matching layer(s) after the flexible front carrier plate has been removed, and thus electrically insulate the individual transducer elements and improve acoustic coupling.

Other features and advantages of the present invention will become apparent from the following description of the preferred embodiment, taken in conjunction with the accompanying drawings, which illustrate, by way of example, the principles of the invention.

DETAILED DESCRIPTION OF THE PREFERRED EMBODIMENT

Figure 1:
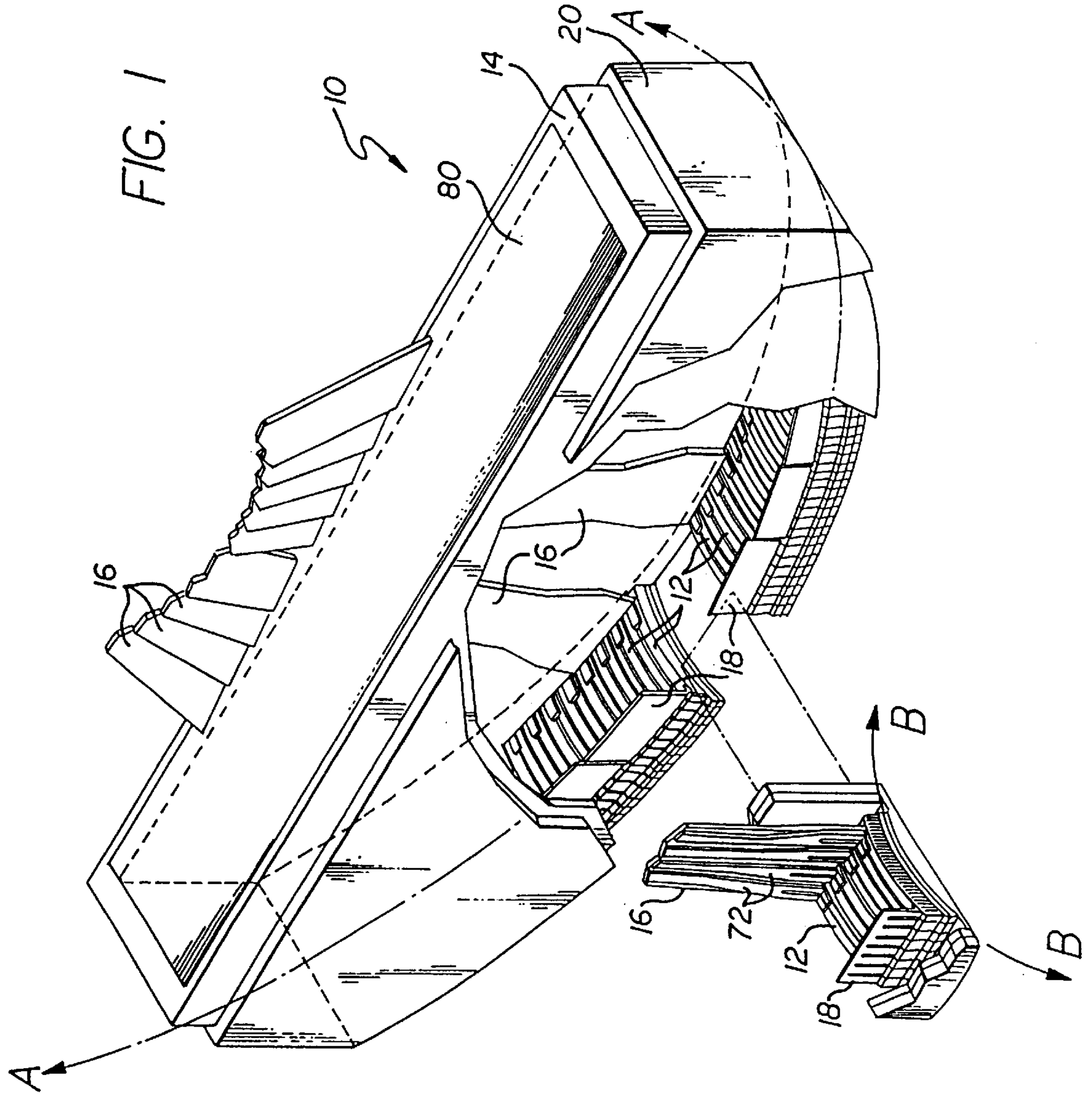
FIG. 1 is an isometric view, partly in section, of a preferred embodiment of an ultrasonic transducer array made according to the present invention. A portion of the array has been set out from the remainder for illustrative purposes.

An ultrasonic transducer array 10 made according to the present invention is shown in FIG. 1. The array includes a plurality of individual ultrasonic transducer elements 12 encased within a housing 14. The individual elements are electrically connected to the leads 16 of a flexible printed circuit board and ground foils 18 that are fixed in position by a polymer backing material 80. A dielectric face layer 20 is formed around the array and the housing.

Figure 2A:
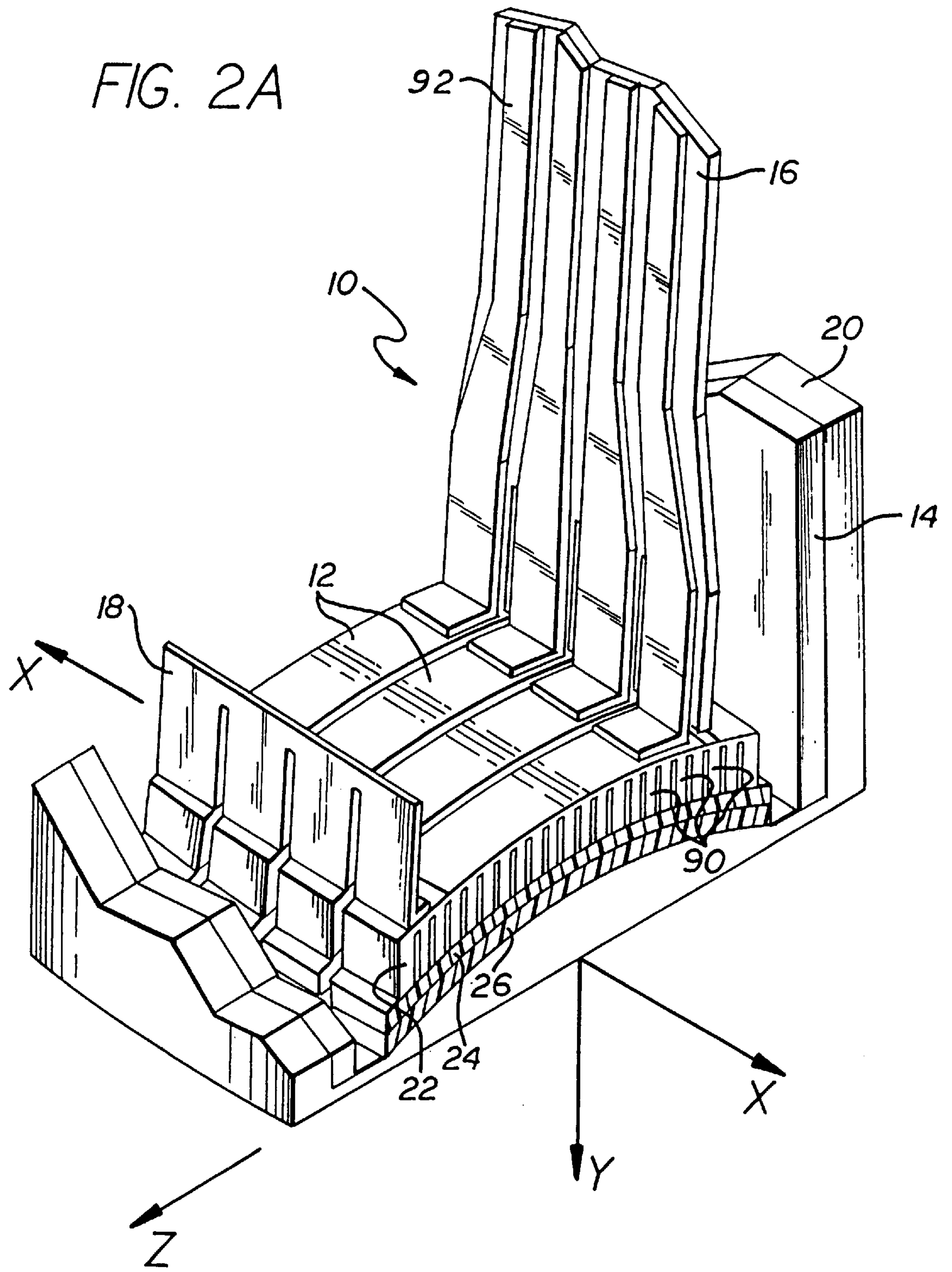
FIG. 2A is an enlarged sectional view of the set out portion of the array in FIG. 1 showing the transducer elements in detail.

Each individual ultrasonic transducer element 12 is made up of a piezoelectric layer 22, a first acoustic matching layer 24 and a second acoustic matching layer 26 (see also FIG. 2A). The individual elements are mechanically focused into a desired imaging plane (defined by the x-y axes) due to the concave shape of the piezoelectric and adjoining acoustic matching layers. The individual elements are also mechanically isolated from each other along an array axis A located in the imaging plane (as may be defined by the midpoints of the chords extending between the ends of each transducer element). Front surfaces of the piezoelectric layer 22 and acoustic matching layers 24, 26 are concave in the direction of an axis B perpendicular to the array of axis A.

In the preferred embodiment, the array axis A has a convex shape to enable sector scanning. It will become apparent from the following, however, that the array axis may be straight or curvilinear or may even have a combination of straight parts and curved parts.

Figure 3:
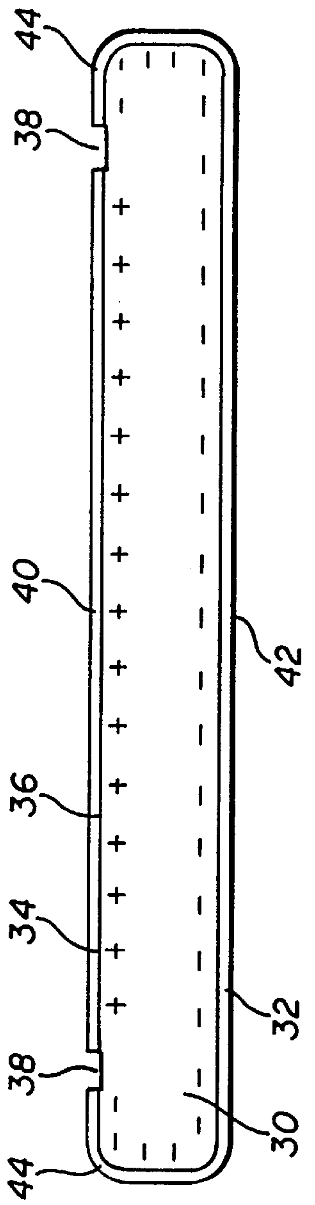
FIG. 3 is a cross-sectional end view of the piezoelectric substrate of the present invention.

The array of individual ultrasonic transducer elements may be made in the following preferred manner. With reference to FIG. 3, a piece of piezoelectric ceramic material is ground flat and cut to a rectangular shape to form a substrate 30 having a front surface 32 and a rear surface 34. A particularly suitable piezoelectric ceramic material is one made by Motorola Ceramic Products, type 3203HD. This material has high density and strength which facilitate the cutting steps to be made without fracture of the individual elements.

The piezoelectric substrate 30 is further prepared by applying a metallization layers 36 such as by first etching the surfaces with a 5% fluoboric acid solution and then electroless nickel plating using commonly available commercial plating materials and means. Other methods may be substituted for plating the piezoelectric such as vacuum deposition of chromium, nickel, gold, or other metals. The plating material is made to extend completely around all the surfaces of the piezoelectric substrate. In the preferred embodiment a subsequent copper layer (approximately 2 micron thickness) is electroplated onto the first nickel layer (approximately 1 micron thickness) followed by a thin layer of electroplated gold (<0.1 micron thickness) to protect against corrosion.

The metallization layer 36 is isolated to form two electrodes by making two saw cuts 38 through the rear surface 34 of the piezoelectric substrate. A wafer dicing saw may be used for this purpose. The two saw cuts form a rear surface electrode 40 and a separate front surface electrode 42. The front surface electrode includes wraparound ends 44 that extend from the front surface 32 around to the rear surface 34 of the piezoelectric substrate. The wrap-around ends 44 preferably extend approximately 1 mm along each side of the rear surface.

Figure 4:
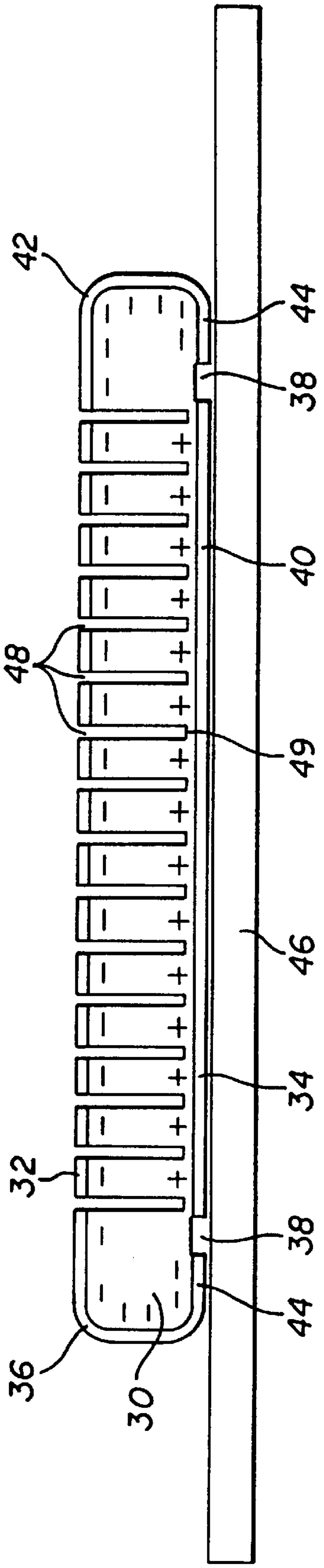
FIG. 4 is a cross-sectional end view of the piezoelectric substrate of FIG. 3 having a series of saw cuts.

With reference to FIG. 4, the metallized and isolated piezoelectric substrate 30 is prepared for cutting by turning it over and mounting the rear surface electrode 34 to a carrier film 46, such as an insulating polyester film. A thermoplastic adhesive may be used to affix the piezoelectric substrate to the carrier film. Using a wafer dicing saw, a series of saw cuts 48 are made substantially through the piezoelectric substrate 30 preferably leaving only a small amount, for example 50 microns, of substrate material uncut between an inner end 49 of the saw cuts and the rear surface 34 of the substrate. Alternatively, the saw cuts may be made through the substrate 30, including into, but not all the way through, the rear surface electrode. When a sufficient number of cuts are made across the piece and with a small distance between them, the substrate becomes flexible so as to be later curved or concavely formed as desired, as will be described in detail later. Alternatively, the substrate may be left flat.

Another purpose of the saw cuts 48 is to minimize lateral resonance modes in the completed device. In this regard, the saw cuts may be filled with a low durometer, lossy, epoxy material. Additionally, the cuts may be made to have a regular spacing between them, other ordered spacing or, alternatively, a random spacing to further suppress unwanted resonance modes near the operating frequency of the transducer array.

In the preferred embodiment, the periodicity of the saw cuts is approximately one-half the thickness of the substrate (measured from the front to the rear surface). If, however, the substrate is too thin to permit this, the saw cuts may be randomly located, with the distance between adjacent saw cuts varying in length from a predetermined maximum of approximately two times the thickness of the substrate to a predetermined minimum of approximately one-half the thickness. A blade having a thickness of about 0.001–0.002 inches may be used.

It will be appreciated by those skilled in the art that, although a specific preferred method of preparing the piezoelectric substrate for forming is described above, the substrate may otherwise be formed into a concave shape by machining, thermoforming or other known methods. The term concave is meant to include indentations that are formed of curved segments or straight segments or a combination thereof. It will further be appreciated that a variety of piezoelectric materials may be used with the present invention, including ceramics (e.g., lead zinconate, barium titanate, lead metaniobate and lead titanate), piezoelectric plastics (e.g., PVDF polymer and PVDF-TrFe copolymer), composite materials (e.g., 1–3 PZT/polymer composite, PZT powders dispersed in polymer matrix (0–3 composite) and compounds of PZT and PVDF or PVDF-TrFe), or relaxor ferroelectrics (e.g., PMN:PT).

Figure 5:
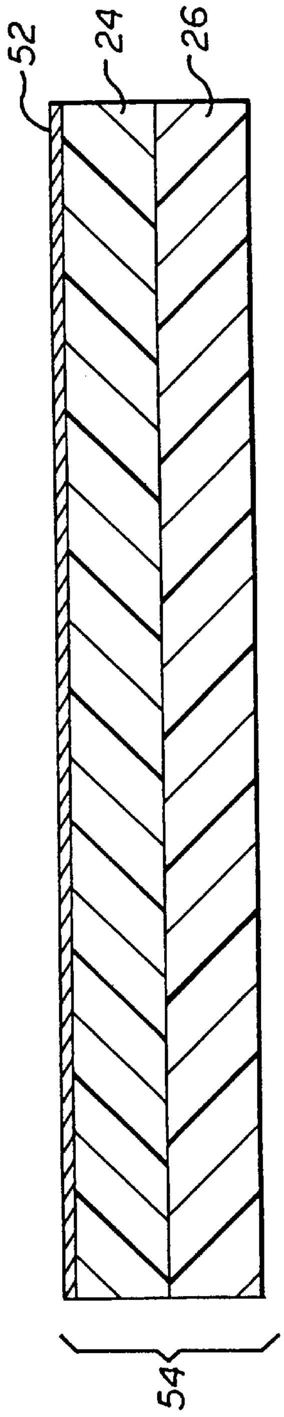
FIG. 5 is a cross-sectional end view of the acoustic matching layer(s) substrate of the present invention.

The method of preparing the acoustic matching layers will now be described with reference to FIG. 5. In particular, first and second acoustic matching layers 24, 26, respectively, are shown. The acoustic matching layers may be each formed of a polymer or polymer composite material of uniform thickness approximately equal to one quarter wavelength as determined by the speed of sound in each material when affixed to the piezoelectric substrate 30. The acoustic impedance of these quarter wave layers is chosen to be an intermediate value between that of the piezoelectric substrate and that of the body or medium to be interrogated. For example, in the preferred embodiment of the present invention, the bulk acoustic impedance of the piezoelectric material is approximately 29 MRayls. The acoustic impedance of the first quarter wave matching layer 24 is approximately 6.5 MRayls. This acoustic impedance may be obtained by an epoxy filled with lithium aluminum silicate. The impedance of the second quarter wave matching layer 26 is approximately 2.5 MRayls and can be formed of an unfilled epoxy layer.

In the preferred embodiment a flat, polished, tooling plate (not shown) made of titanium is used as a carrier to fabricate the acoustic matching layers. As a first step, a copper layer 52, or other electrically conductive material, approximately 1 micron in thickness is electroplated onto the flat surface of the titanium tooling plate. The first acoustic matching layer made of epoxy material is then cast onto the copper layer to which it bonds during cure. This epoxy layer is then ground to a thickness equal to approximately one quarter wavelength at the desired operating frequency (as measured by the speed of sound in the material). The second acoustic matching layer is similarly cast and ground to approximately one quarter wavelength in thickness (as measured by the speed of sound in the material). To improve the bond between the copper layer and the first acoustic matching layer, a tin layer (not shown) may be electroplated onto the copper layer.

After grinding of the second acoustic matching layer is complete, the matching layers and bonded copper layer are released from the titanium plate to yield a lamination of the two acoustic matching layers and the copper layer. In this way an acoustic matching layer substrate 54 is formed which has an electrically conductive surface on at least one of its surfaces.

In the preferred embodiment, two acoustic matching layers and a copper layer are used as described above. It should be noted, however, that more than two matching layers may be used and there are several means by which these quarter wave layers can be formed. Alternatively, an electrically conductive material possessing suitable acoustic impedance, such as graphite, silver filled epoxy, or vitreous carbon, may be used for the first matching layer and the copper layer omitted. It is also possible to use a single matching layer with an acoustic impedance of approximately 4 Mrayls, for example, instead of multiple matching layers. The quarter wave materials may also be formed by molding onto the surface of the piezoelectric substrate or, alternatively, by casting and grinding methods.

Figure 6A:
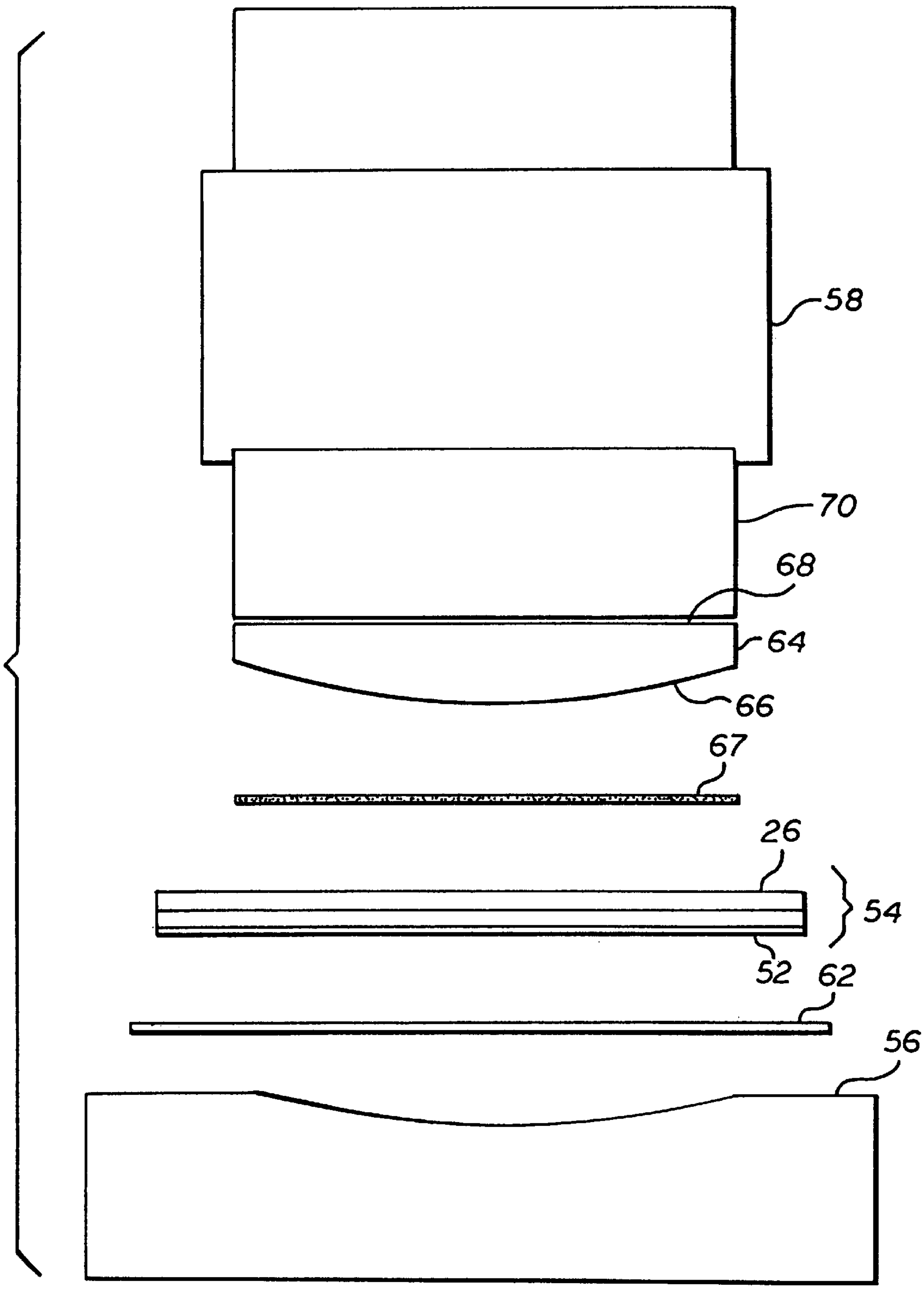
FIGS. 6A and 6B are end views showing the pressing operations of the present invention.

Next, the preferred method of concavely forming the piezoelectric substrate 30 and the acoustic matching layer substrate 54 will be described. With reference to FIG. 6A, a press having a concave base form 56 and a press bar 58 is shown. The acoustic matching layer substrate 54 is inserted between the base form and the press bar with the copper layer 52 facing the base form 56. As the piezoelectric substrate 30 will be bonded to the copper layer in a subsequent pressing operation, a plastic shim 62 is placed between the copper layer and the base form to compensate for any deviation.

At the same time as the acoustic matching layer substrate is pressed into the concave form, a flexible front carrier plate 64 is temporarily mounted to the front of the second acoustic matching layer 26. The carrier plate 64 has a convex surface 66 facing the second acoustic matching layer. The curvature of the convex surface is similar to the curvature being pressed into the acoustic matching layer substrate. A thermoplastic adhesive layer 67 may be used to maintain the bond between the carrier plate 64 and the substrate 54 such that at temperatures below 120° C., for example, the carrier plate will remain fixed to the matching layers. The carrier plate also has a flat surface 68 for temporarily mounting to a dicing bar 70. A spray adhesive may be used to mount the carrier plate to the dicing bar, the latter being detachably mountable to the press bar 58.

Figure 6B:
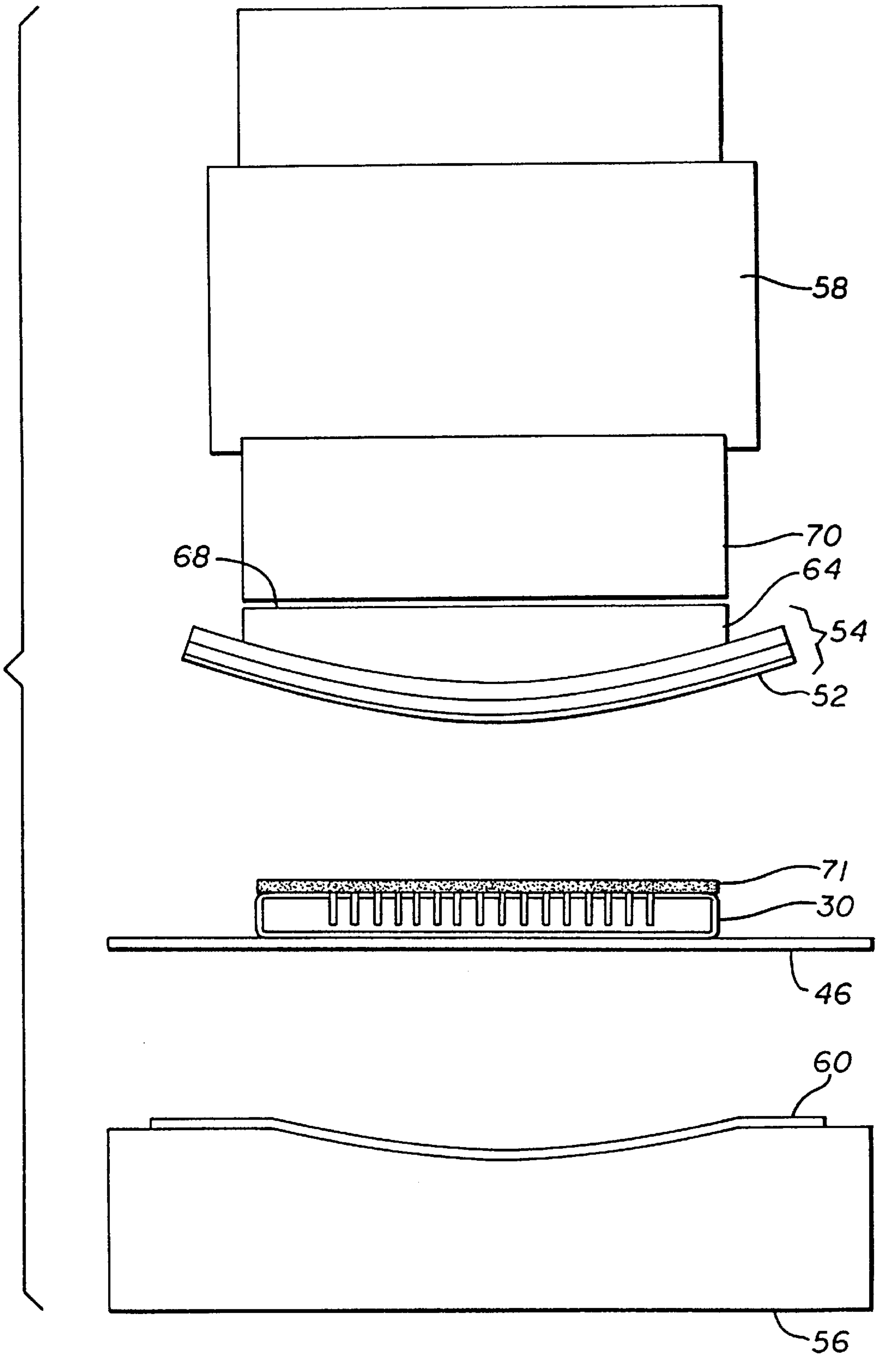

After the first pressing operation wherein the acoustic matching layer substrate 54 is concavely formed and temporarily bonded to the flexible front carrier plate 64, the press is prepared for a second pressing operation by placing the piezoelectric substrate 30 (still mounted to its carrier film 46) between the pressed acoustic matching layer substrate and the base form 56 (see FIG. 6B). A thin plastic shim 60 may be placed between the piezoelectric substrate and the base form to account for deviations in the curvature of the base form.

At the same time as the piezoelectric substrate 30 is concavely formed, the acoustic matching layer substrate 54 with the flexible front carrier plate may be permanently bonded to the piezoelectric substrate using a suitable adhesive 71. If desired, a tin layer (not shown) may be electroplated to the copper layer to strengthen the bond. In the preferred embodiment, both pressing operations are conducted at an elevated temperature, e.g., by placing the press in an oven.

After pressing, the resultant bonded and formed piezoelectric and acoustic matching layer substrates are removed from the press. The carrier film 46 is then removed and the edges trimmed to form an intermediate assembly 72 (see FIG. 7). The pressing operation just described results in a mechanically focused piezoelectric substrate with corresponding acoustic matching layers.

Figure 7:
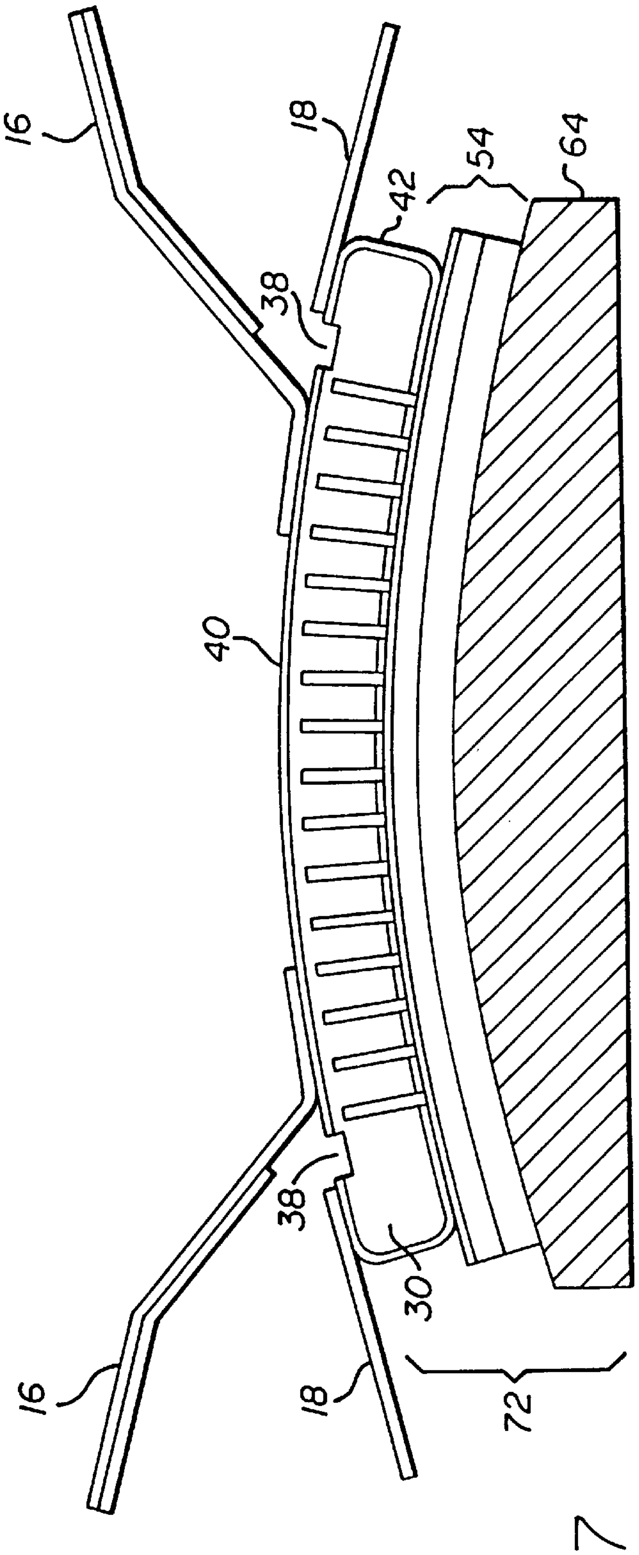
FIG. 7 is a cross-sectional end view of the piezoelectric and acoustic matching layer substrates mounted to the flexible front carrier plate according to the present invention.
Figure 8:
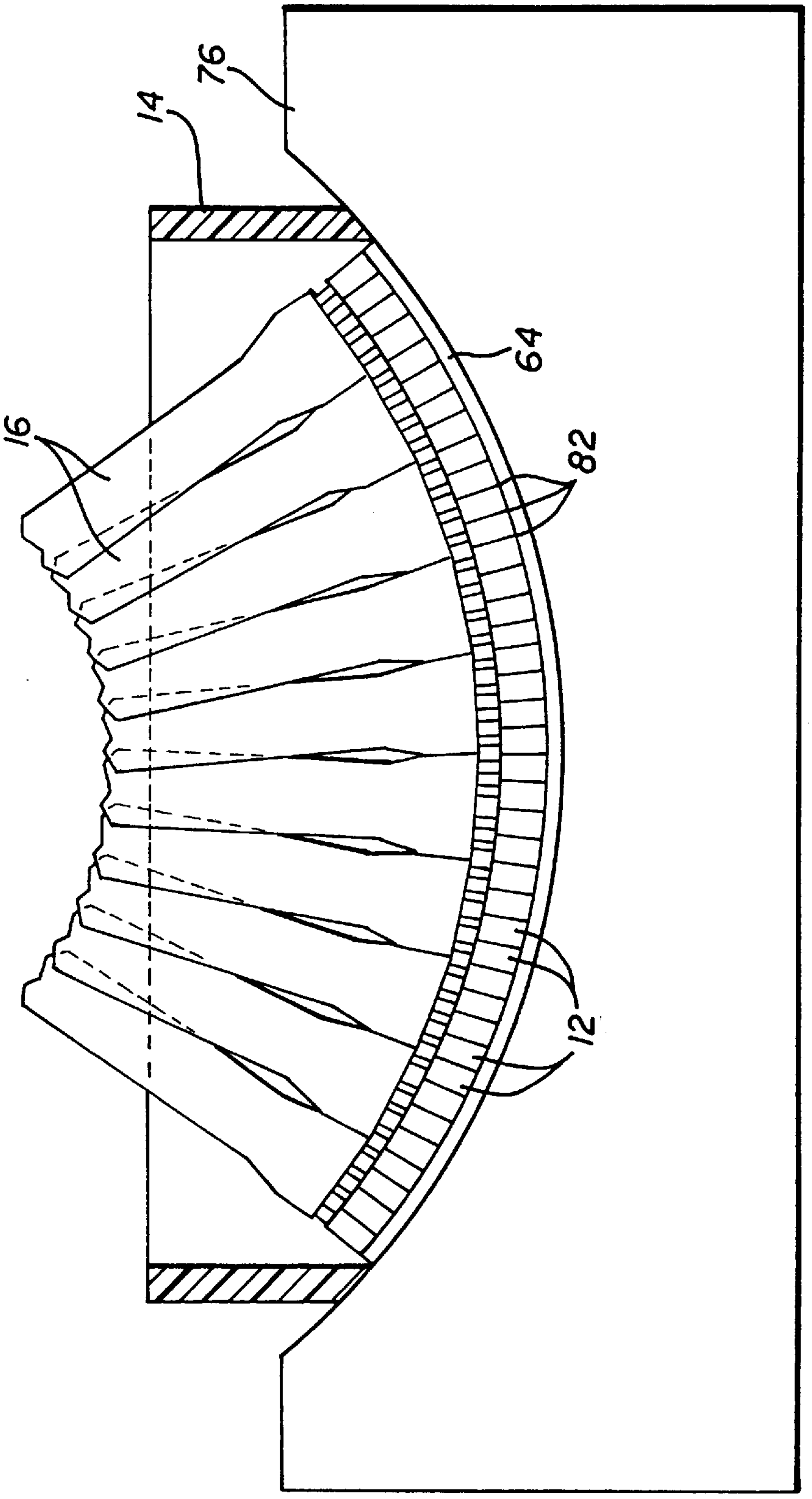
FIG. 8 is a cross-sectional front view of the front carrier plate and corresponding transducer elements with flexible printed circuit leads, mounted to a convex form tool according to the present invention.

With reference to FIGS. 7 and 8, the electrical connections may be made by soldering the two copper "ground foil" strips 18 to the wrap around front surface electrode 42 adjacent each isolation cut 38 on the concavely formed piezoelectric substrate 30. The leads 16 of the flexible printed circuit board are then soldered to the rear surface electrode 40 adjacent each isolation cut and opposite the ground foil strips on the concavely formed piezoelectric substrate.

Before dicing, the leads 16 and ground foil 18 are folded over to extend down past the flexible front carrier plate 64 and a wafer dicing saw is mounted over the intermediate assembly 72 (with the dicing bar 70 still attached). The individual transducer elements 12 of the array are formed by making a series of parallel saw cuts 82 orthogonal to the imaging plane, dicing through the leads 16 of the flexible printed circuit board, the ground foils 18, the piezoelectric substrate 30 and acoustic matching layer substrate 54, but not completely through the flexible front carrier plate 64. In this manner, the individual array elements and corresponding lead attachments are isolated from each other. In the preferred embodiment, the spacing between the saw cuts 48 in the piezoelectric substrate (see FIG. 4) and the spacing between the saw cuts 82 in the intermediate assembly 72 are uniform and equal forming a plurality of piezoelectric rods 90 in the array (see FIG. 2A).

It will be appreciated that, by folding the leads and ground foils down before dicing, the leads and ground foils are only partially cut, thus maintaining the integrity of the flexible printed circuit board and the ground connections (see, e.g., FIG. 2A). In FIG. 7, two leads 16 are shown. In this case, alternating transducer elements are connected to leads on one side while the intervening transducer elements are connected to leads on the other side. The additional ground foil is a redundancy.

Figure 2B:
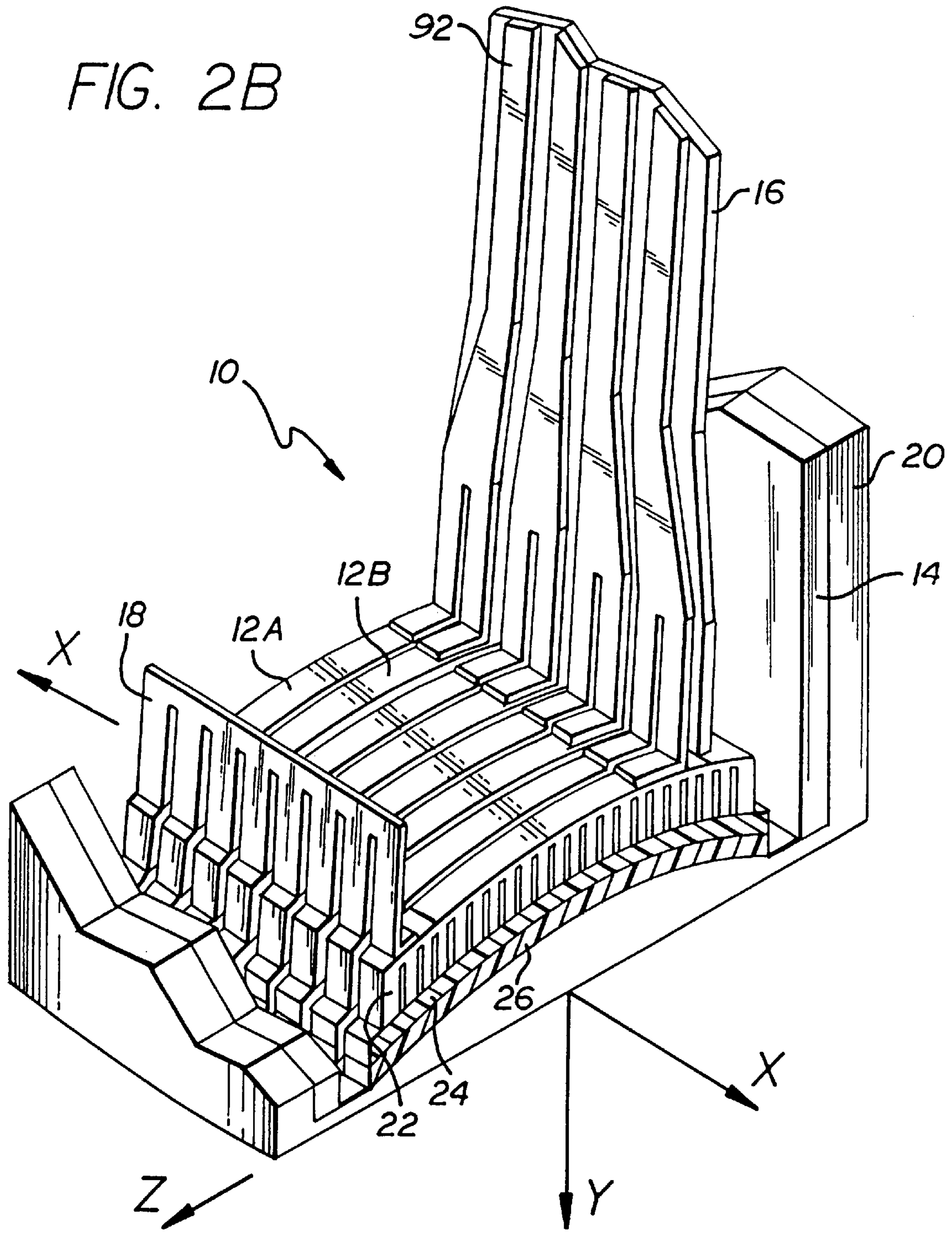
FIG. 2B is a modified form of the portion of the array in FIG. 2A showing transducer subelements.

In an alternative embodiment shown in FIG. 2B, the ultrasonic transducer array has several transducer elements, with each element composed of two subelements 12A, 12B, electrically connected in parallel. Such an array is constructed by dicing the intermediate assembly such that saw cuts are made not only between signal conductors 72 on the leads 16 of the flexible printed circuit, but also through the signal conductors themselves. The subelements help reduce spurious lateral resonance modes and inter-element crosstalk. Alternatively, the transducer element may be composed of more than 2 subelements.

Referring to FIG. 8, after dicing, the dicing bar 70 is removed and the flexible front carrier plate 64 and associated individual transducer elements 12 may be formed along the desired array axis by bending and temporarily affixing the carrier plate to a convex, concave, or straight form tool 76. The housing 14 made of any suitable material (e.g., aluminum), is then mounted around said front carrier plate and corresponding array elements. In the preferred embodiment, the saw cuts 82 are filled with a low impedance acoustically attenuative material, such as a low durometer polyurethane (not shown), to improve resonance qualities.

With reference to FIG. 8, the polymer backing material 80 (see also FIG. 1) is cast into the cavity formed by the housing 14 and front carrier plate 64 to encapsulate the transducer elements and corresponding electrical lead attachments. Such backing material ideally has a low acoustic impedance for example <2 MRayls and may be composed of a polymer filled with plastic or glass microballoons to reduce its acoustic impedance. Alternatively, a higher acoustic impedance compound can be used to improve the frequency bandwidth of the transducer elements with some reduction in sensitivity.

Figure 9:
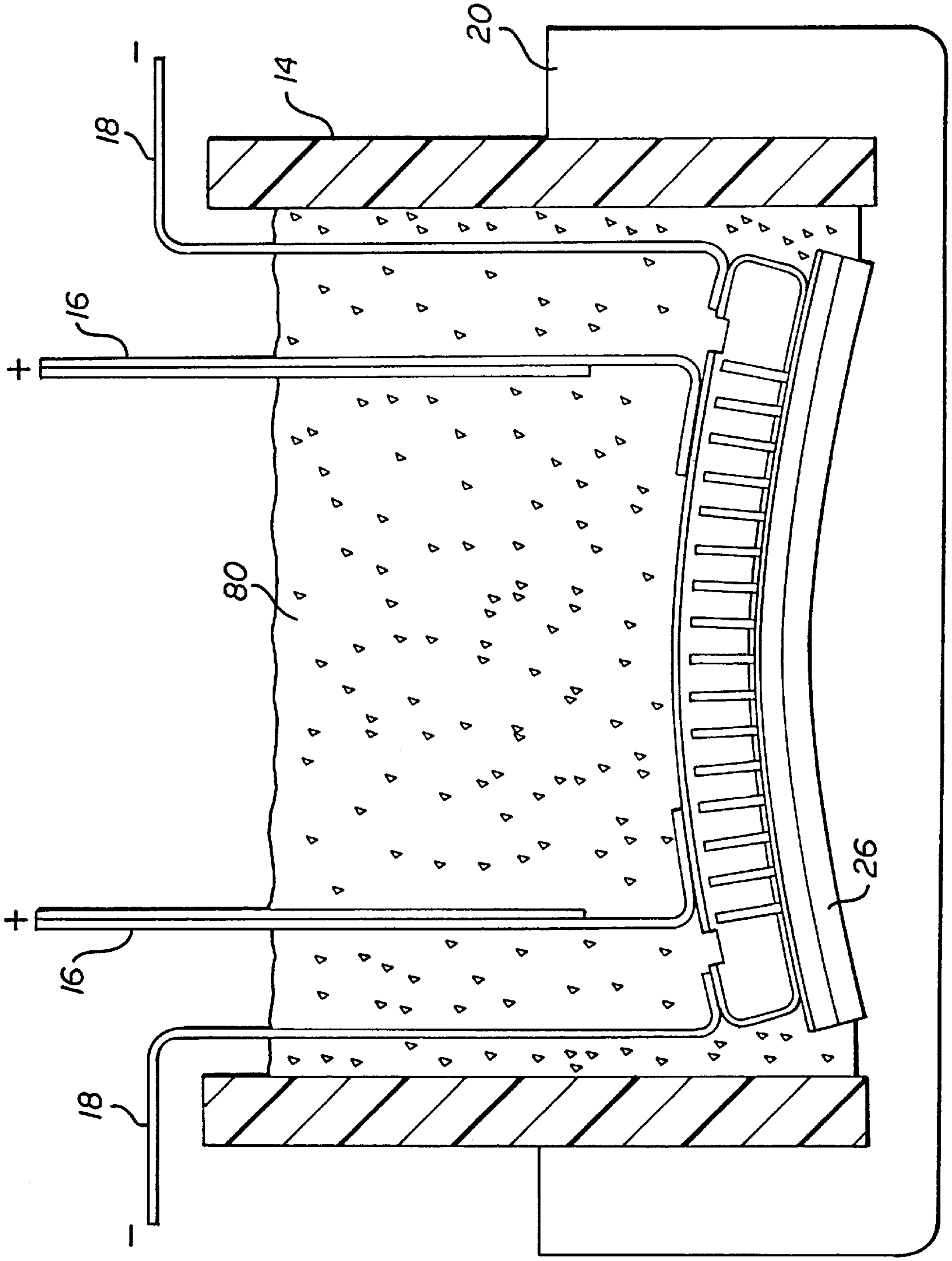
FIG. 9 is a cross-sectional end view of a transducer element and corresponding lead attachments encapsulated by a dielectric face layer and a backing material according to the present invention.

To arrive at the finished product, the flexible front carrier plate 64 is removed by heating the transducer array to a temperature greater than 120° C. and peeling away the carrier plate to expose the concave surface of the second matching layer 76. The transducer elements remain fixed in the housing by the polymer backing material 80. With reference to FIG. 9, the array is then placed in a mold (not shown) into which polyurethane polymer is poured to form the dielectric face layer 20 that fills and seals the concave surface of the second matching layer 26 and forms an outer surface (e.g. flat or convex) chosen to achieve improved acoustic coupling to the body to be tested. The speed of sound in the face layer is chosen to be close to that of the medium into which the sound will propagate or into the medium to be tested in order to minimize defocusing effects. An acoustic impedance of 1.6 MRayls provides for a good match between the quarter wave layer and a medium such as water or human body tissue.

It should be appreciated from the foregoing description that the present invention provides an ultrasonic transducer array having individual transducer elements that are mechanically focused by using concave piezoelectric elements and adjacent, similarly concave, uniform thickness, acoustic matching layers, without the necessity of an acoustic lens. The individual transducer elements are acoustically isolated from each other along the array axis and are separated from each other by cutting substantially through the piezoelectric substrate and matching layers to form independent elements.

It will, of course, be understood that modifications to the presently preferred embodiment will be apparent to those skilled in the art. Consequently, the scope of the present invention should not be limited by the particular embodiments discussed above, but should be defined only by the claims set forth below and equivalents thereof.

What is claimed is:

1. A method for manufacturing an ultrasonic transducer array, comprising:

providing a flat piezoelectric substrate having front surface overlaid by a front electrode and a rear surface overlaid by a rear electrode;

cutting a series of substantially parallel slots substantially through the piezoelectric substrate from the substrate's front surface;

mounting an acoustic matching layer in front of the slotted front surface of the piezoelectric substrate to produce an intermediate assembly, wherein the acoustic matching layer is configured to provide an electrically conductive path across the series of slots of the piezoelectric layer;

affixing the intermediate assembly to a front carrier plate;

cutting a series of substantially parallel cuts substantially through the piezoelectric substrate and the acoustic matching layer of the intermediate assembly from the rear surface of the piezoelectric substrate, the series of parallel cuts being made in planes substantially perpendicular to the series of parallel slots previously made substantially through the piezoelectric substrate, the series of parallel cuts forming a plurality of individual transducer elements;

applying a backing material to the rear surface of the piezoelectric substrate of the intermediate assembly; and removing the front carrier plate to yield an ultrasonic transducer array.

2. A method as defined in claim 1, wherein the series of substantially parallel slots are spaced apart substantially uniformly.

3. A method as defined in claim 1, wherein the series of substantially parallel slots are spaced apart substantially randomly between a predetermined minimum spacing and a predetermined maximum spacing.

4. A method as defined in claim 1, wherein:

the plurality of individual transducer elements are arranged along an array axis; and the method further comprises forming the slotted piezoelectric substrate in a press such that the substrate's front surface is concave in directions perpendicular to the array axis.

5. A method as defined in claim 4, wherein forming the slotted piezoelectric substrate and applying the acoustic matching layer are performed substantially simultaneously.

6. A method as defined in claim 1, wherein providing the piezoelectric substrate further includes placing an elastomeric filler material in the slots cut substantially through the piezoelectric substrate, to acoustically isolate the adjacent segments.

7. A method as defined in claim 6, wherein the elastomeric filler material is an epoxy material.

8. A method as defined in claim 1, wherein:

cutting the series of substantially parallel slots through the piezoelectric substrate cuts completely through the front electrode; and mounting an acoustic matching layer includes forming a thin, metallic electrode layer on the underside of the acoustic matching layer, and applying the acoustic matching layer to the piezoelectric substrate with the electrode layer of the acoustic matching layer electrically contacting the front electrode of the piezoelectric substrate.

9. A method as defined in claim 1, wherein the electrically conductive path means is the acoustic matching layer.

10. A method as defined in claim 1, wherein the front carrier plate is flexible.

11. A method as defined in claim 10, wherein cutting the series of substantially parallel cuts includes cutting completely through the intermediate assembly into the front carrier plate.

12. A method as defined in claim 10, wherein removing the front carrier plate includes placing an elastomeric filler material in the series of substantially parallel cuts exposed in the intermediate assembly, to acoustically isolate the individual transducer elements.

13. A method as defined in claim 10, and further including forming the intermediate assembly into a desired shape by bending the substrate and matching layer against the yielding bias of the flexible front carrier plate.

14. A method as defined in claim 10, wherein mounting the acoustic matching layer includes affixing the acoustic matching layer to the front carrier plate with a thermoplastic adhesive that loses its adhesion above a predetermined temperature.

15. A method as defined in claim 1, and further comprising:

attaching flexible printed circuit signal conductors to the rear electrode on the rear surface on the piezoelectric substrate; and attaching a flexible ground conductor to the front electrode on the front surface on the piezoelectric substrate;

wherein the step of cutting the series of substantially parallel cuts includes cutting the signal conductors so as to electrically isolate a separate signal conductor for each transducer element.

16. A method as defined in claim 1, wherein:

the plurality of individual transducer elements are aligned along an array axis; and the method further comprises providing means for focusing each of the plurality of transducer elements in a plane perpendicular to the array axis.

17. A method as defined in claim 1, wherein:

the plurality of individual transducer elements are aligned along an array axis; and the method further comprises providing an acoustic lens for focusing each of the plurality of transducer elements in a plane perpendicular to the array axis.

18. A method as defined in claim 1, wherein:

the plurality of individual transducer elements are aligned along an array axis; and the method further comprises providing the front surface of the piezoelectric substrate with a concave shape in a direction perpendicular to the array axis, for focusing each of the plurality of transducer elements in a plane perpendicular to the array axis.

19. A method as defined in claim 1, wherein providing the intermediate assembly includes:

metallizing all of the surfaces of the piezoelectric substrate; and cutting through the metallization on the rear surface of the piezoelectric substrate to form the rear electrode on the rear surface of the substrate and the front electrode on the front surface of the substrate, wherein the front electrode extends onto a portion of the rear surface of the substrate.

20. A method as defined in claim 1, wherein the front and rear electrodes each include an inner layer of nickel and an outer layer of copper.

21. A method as defined in claim 1, wherein the piezoelectric substrate is a PZT-based material.

22. A method as defined in claim 1, wherein the piezoelectric substrate is a PVDF-based material.

23. A method as defined in claim 1, wherein the piezoelectric substrate is a PMN-based material.

24. A method as defined in claim 1, wherein mounting an acoustic matching layer includes mounting an acoustic matching layer that is substantially uniform.

* * * * *